United States Patent [19]
Kitami et al.

[11] Patent Number: 5,861,704
[45] Date of Patent: Jan. 19, 1999

[54] PIEZOELECTRIC TRANSFORMER

[75] Inventors: Tsuyoshi Kitami; Kiyokazu Isobe, both of Tokyo, Japan

[73] Assignee: NEC Corporation, Tokyo, Japan

[21] Appl. No.: 866,329

[22] Filed: May 30, 1997

[30] Foreign Application Priority Data

May 30, 1996 [JP] Japan ..................................... 8-136701

[51] Int. Cl.⁶ .................................................. H01L 41/08
[52] U.S. Cl. .......................... 310/369; 310/366; 310/357; 310/358; 310/359
[58] Field of Search .................................... 310/316, 317, 310/358, 357, 359, 318, 369, 366

[56] References Cited

U.S. PATENT DOCUMENTS

| | | | |
|---|---|---|---|
| 2,974,296 | 3/1961 | Rosen | 333/187 |
| 3,562,792 | 2/1971 | Berlincourt et al. | 310/359 |
| 3,764,848 | 10/1973 | Berlincourt | 315/55 |
| 5,329,682 | 7/1994 | Thurn et al. | 29/25.35 |
| 5,345,137 | 7/1994 | Funakubo et al. | 310/323 |
| 5,402,031 | 3/1995 | Tagami et al. | 310/359 |

FOREIGN PATENT DOCUMENTS

| | | | |
|---|---|---|---|
| 2650356 | 5/1978 | Germany . | |
| 61-189678A | 8/1986 | Japan . | |
| 2-163982 | 6/1990 | Japan . | |
| 2-311181 | 12/1990 | Japan . | |
| 4-167504A | 6/1992 | Japan . | |
| 4-307322 | 10/1992 | Japan . | |
| A9275231 | 10/1997 | Japan | H01L 41/107 |

*Primary Examiner*—Mark O. Budd
*Assistant Examiner*—Timothy A. Williams
*Attorney, Agent, or Firm*—Sughrue, Mion, Zinn, Macpeak & Seas, PLLC

[57] ABSTRACT

There is provided a piezoelectric transformer including (a) a cylindrical body made of piezoelectric material and longitudinally defining a driven section and a voltage generating section, the voltage generating section being polarized in one of directions in a direction of a longitudinal axis of the cylindrical body, (b) a pair of first electrodes formed at a curved surface of the cylindrical body in the driven section and defining a plurality of regions in the driven section in a direction of a longitudinal axis of the cylindrical body, the first electrodes being electrically isolated with each other, the regions being polarized so that every other regions are polarized in opposite directions in a direction of a longitudinal axis of the cylindrical body, the pair of first electrodes comprising a plurality of strip-shaped electrodes wound around the cylindrical body and disposed in parallel with one another in a direction of a longitudinal axis of the cylindrical body, every other strip-shaped electrodes being in electrical communication with one another so that they have a common voltage, and (c) a second electrode cooperating with one of the first electrodes located closer to the voltage generating section to make a pair therewith. In accordance with the above mentioned piezoelectric transformer, it is possible to prevent edges of a piezoelectric body from being chipped, because of its cylindrical shape. Thus, it is also possible to prevent destruction of a transformer originated from chipping thereof, resulting in higher reliability of a piezoelectric transformer.

58 Claims, 7 Drawing Sheets

PIEZOELECTRIC TRANSFORMER

BACKGROUND OF THE INVENTION

1. Field of the Invention

The invention relates to a piezoelectric transformer, and more particularly to a piezoelectric transformer formed at a surface thereof with input and output electrodes. The invention relates also to a support for a piezoelectric transformer.

2. Description of the Prior Art

There has been widely used a coil-wound type electromagnetic transformer as a transforming device for generating a higher voltage to be used for equipments which requires a high voltage, such as a deflector for a cathode ray tube and a charging device for a copier.

On the other hand, a piezoelectric transformer utilizing piezoelectric effect becomes popular for generating a high voltage. FIG. 1A illustrates one of conventional piezoelectric transformers. The illustrated piezoelectric transformer includes a rectangular planar piezoelectric body 131 defining a driven section 135 and a voltage generating section 136 in a direction of a longitudinal axis of the piezoelectric body 131. The piezoelectric body 131 is formed on an upper surface in the driven section 135 with a first electrode 132, and on a lower surface with a second electrode 133 in alignment with the first electrode 132. The first and second electrodes 121 and 133 are electrically insulated with each other, and it is possible to apply a voltage thereacross.

The piezoelectric body 131 is formed at an end surface in the voltage generating section 136 with a third electrode 137. The piezoelectric body 131 including the three electrodes 132, 133 and 137 is polarized in a widthwise direction thereof in the driven section as indicated with an arrow X1, and polarized in a lengthwise direction thereof in the voltage generating section 136 as indicated with an arrow X2. The piezoelectric transformer is supported and fixed on a support 139 at the center in a direction of a longitudinal axis thereof.

In order to boost a voltage by means of the illustrated piezoelectric transformer, an ac voltage Ein is first applied across the first and second electrodes 132 and 133. The ac voltage Ein is selected to have a frequency equal to a resonance frequency of a longitudinal oscillation of the piezoelectric body 131. By applying the thus selected ac voltage across the first and second electrodes 132 and 133, the piezoelectric body 131 is mechanically resonated, resulting in that a voltage Eout which is higher than Ein and has the same frequency as that of Ein is generated at the voltage generating section 136. The thus generated higher voltage Eout can be obtained between the second (or first) electrode 133 and the third electrode 137. The support 139 supports the piezoelectric transformer at a nodal point of longitudinal oscillation of the piezoelectric body 131.

The above mentioned operation concerns only voltage step-up. By substituting the first and second electrodes 132 and 133 used as input ports and the third electrode 137 used as an output port with each other, that is, by applying an ac voltage across the second and third electrodes 133 and 137 and obtaining a voltage between the first and second electrodes 132 and 133, the illustrated piezoelectric transformer acts also as a step-down transformer. It depends on the purpose of using the piezoelectric transformer whether electrodes formed on a surface of a piezoelectric body are used as input or output electrodes, and whether sections defined in a piezoelectric body are used as driven or voltage generating sections.

In order to put the above mentioned piezoelectric transformer illustrated in FIG. 1A to practical use, it is necessary to provide the first to third electrodes 132, 133 and 137 with a terminal such as a lead wire for electrically connecting the piezoelectric transformer to an external circuit. However, such lead wires are not always connected to the electrodes 132, 133 and 137 both in the driven and voltage generating sections 135 and 136 at nodal points of mechanical oscillation of the piezoelectric body 131. Thus, the lead wires connected to the electrodes are often broken down. In order to enhance reliability in connection between the surface electrodes and the lead wires, it is effective that lead wires are connected to surface electrodes at nodal points of oscillation of a piezoelectric body. To this end, there are often defined three sections in a piezoelectric body.

FIG. 1B illustrated an example of a piezoelectric transformer having a piezoelectric body 141 including three sections defined therein in a direction of a longitudinal axis thereof. Namely, the piezoelectric body 141 includes a left side driven section 145L, a right side driven section 145R, and a voltage generating section sandwiched the driven sections 145L and 145R. The voltage generating section is partitioned into two sections 146L and 146R by a strip-shaped electrode 147 wound around the piezoelectric body 141 at a longitudinal midpoint of the piezoelectric body 141. Thus, the piezoelectric body 141 includes four sections: the left side driven section 145L, left side voltage generating section 146L, right side voltage generating section 146R and right side driven section 145R, which sections are arranged symmetrically about the electrode 147. The piezoelectric body 141 is formed on upper and lower surfaces thereof in the left side driven section 145L with input electrodes 142L and 143L. Similarly, the piezoelectric body 141 is formed on upper and lower surfaces thereof in the right side driven section 145R with input electrodes 142R and 143R. The driven sections 143L and 143R are polarized in a thicknesswise direction of the piezoelectric body 141, as indicated with an upwardly directed arrow X1. The voltage generating sections 146L and 146R are polarized in a lengthwise direction of the piezoelectric body 141, similarly to the piezoelectric transformer illustrated in FIG. 1A, but in opposite directions, as indicated with arrows X2 and X3. That is, the left side voltage generating section 146L is polarized to the left in a direction of a longitudinal axis of the piezoelectric body 141, as indicated with the arrow X2, whereas the right side voltage generating section 146R is polarized to the right in a direction of a longitudinal axis of the piezoelectric body 141, as indicated with the arrow X3. The upper input electrodes 142L and 142R are electrically connected by a wire W1, and the lower input electrodes 143L and 143R are electrically connected by a wire W2. An ac voltage Ein is applied across the upper input electrodes 142L and 142R and the lower input electrodes 143L and 143R through the wires W1 and W2. An output voltage Eout, which is higher than Ein, is obtained between the electrode 147 and the upper input electrodes 142L and 142R. The ac voltage Ein is selected to have a frequency which causes tertiary resonance in a direction of a longitudinal axis of the piezoelectric body 141. By applying the thus selected ac voltage Ein to the electrodes, the piezoelectric body 141 has three nodal points in oscillation thereof: a point A1 at a distance of one-sixth of a full longitudinal length L of the piezoelectric body 141 away from an end surface 14a of the piezoelectric body 141; a point A2 at a distance of one-sixth of the length L away from the other end surface 141b of the piezoelectric body 141; a point A3 located at the midpoint of the length L. Thus, it is possible to prevent break-down of lead wires due to oscillation of the piezoelectric body 141 by connecting the lead wires to the surface electrodes 142L, 143L, 142R, 143R and 147 at the nodal points A1, A2 and A3.

The planar piezoelectric transformers as mentioned above is small in size, but can produce a high voltage, and hence is very attractive, for instance, to an invertor to be used for a liquid crystal back light, which is requested to be smaller in size. However, the planar piezoelectric transformers still have the following problems to be solved which are accompanied by the fact that a piezoelectric transformer is planar.

The first problem is as follows. When a piezoelectric body is oscillated, a larger internal stress is generated in the vicinity of nodal points of oscillation in the piezoelectric body. Specifically, tensile stresses are produced at a boundary between the driven section 135 and the voltage generating section 136 in the piezoelectric transformer illustrated in FIG. 1A and in the vicinity of the electrode 147 in the piezoelectric transformer illustrated in FIG. 1B, respectively, and thus the piezoelectric bodies 131 and 141 are in conditions to be readily destructive. A piezoelectric transformer is usually designed so that the tensile stress is lower than a critical value for destruction of a piezoelectric body. However, ceramic of which a piezoelectric body is often made is likely to be chipped even by small impact, and a chipping has occurred once in a piezoelectric body, the critical value is significantly lowered, resulting in that a piezoelectric body is easily destroyed.

A chipping as mentioned above in a piezoelectric body is unavoidable in piezoelectric body fabrication steps and subsequent steps, and hence is a major factor for preventing enhancement in reliability to a piezoelectric transformer. In addition, a piezoelectric body has to be treated with the greatest possible care, which increases fabrication costs of a piezoelectric transformer. A chipping, reduction in reliability due to a chipping, and increased fabrication costs as mentioned above are problems in particular when a piezoelectric body is formed in a rectangular parallelopiped such as a plate and a prism. This is because a rectangular parallelopiped has many edges at which a chipping is prone to take place.

The second problem of a planar piezoelectric transformer is that noises tend to be produced in audible ranges. Since a piezoelectric transformer utilizes mechanical oscillation, a frequency for operation of a piezoelectric transformer is selected to be in the range of about 30 to about 150 kHz which is beyond audible range. In a planar piezoelectric transformer, there would be generated longitudinal oscillation in a widthwise direction, bending oscillation and torsional oscillation as well as longitudinal oscillation in a direction of a longitudinal axis of a piezoelectric body. Thus, frequencies of those oscillations, a beat frequency between two different oscillations, and a beat frequency between higher mode frequency of various oscillations and another mode frequency enter audible range. Such frequencies entering audible range would be merely a noise to men's ears, which poses a problem in putting a planar piezoelectric transformer into practical use. Even if a piezoelectric transformer is fabricated in the form other than a plate, there would be produced various oscillation modes. However, a piezoelectric transformer fabricated in the form of a planar plate would quite readily produce unpreferable modes of oscillation, which oscillation in addition is likely to become greater in level.

In order to solve the above mentioned problems caused by the fact that a piezoelectric body is planar in shape, there has been suggested piezoelectric bodies in various forms.

U.S. Pat. No. 2,974,296 has suggested a columnar piezoelectric transformer. The piezoelectric transformer has a thin-walled columnar piezoelectric body defining three sections in a direction of a longitudinal axis thereof. Ring-shaped electrodes are wound around the piezoelectric body at boundaries among the three sections and at opposite ends. Among the four electrodes disposed longitudinally of the piezoelectric body, two of the internally located electrodes are used as driven electrodes, whereas two of the externally located electrodes are used as voltage generating electrodes. Since it is difficult in the above mentioned piezoelectric transformer to make a step-up ratio greater, which is defined as a ratio of an input voltage to an output voltage, U.S. Pat. No. 2,974,296 has also suggested a piezoelectric transformer including a driven section defined between outer and inner surfaces of a piezoelectric body, and a voltage generating section defined over a full length of a piezoelectric body.

Japanese Unexamined Patent Publication No. 2-311181 has suggested a columnar piezoelectric motor including cross type finger electrodes.

Japanese Unexamined Patent Publication No. 2-163982 has suggested a piezoelectric actuator including electrodes spirally extending on an outer surface thereof.

Japanese Unexamined Patent Publication No. 4-307322 has suggested a columnar piezoelectric gyro.

The piezoelectric transformer suggested in U.S. Pat. No. 2,974,296 does not have purposes of prevention of chipping in a piezoelectric body and prevention of noises. The above mentioned piezoelectric motor, piezoelectric actuator and piezoelectric gyro are devices used for electrical-mechanical energy conversion or mechanical-electrical energy conversion. In a device such as a motor or a gyro necessarily including mechanical rotation, a piezoelectric body is inevitably columnar in shape. In contrast, a piezoelectric transformer acting as an electrical-mechanical energy convertor may have any shape, but it is not known so far to fabricate a piezoelectric transformer including a cylindrical piezoelectric body.

SUMMARY OF THE INVENTION

It is an object of the present invention to provide a piezoelectric transformer free of chipping at edges of a piezoelectric body in fabrication thereof. By preventing chipping at edges of a piezoelectric body, it is possible to prevent a piezoelectric transformer from being destroyed due to chipping thereof with the result of higher reliability, and also possible to treat a piezoelectric transformer without so great care to thereby enhance fabrication efficiency and non-defectiveness rate, resulting in lower fabrication costs.

Another object of the present invention is to suppress unnecessary mode of oscillations. This ensures that noises are prevented from being produced in audible frequency range when a piezoelectric transformer is in operation, and that it is no longer necessary to take removal of unnecessary modes of oscillation into consideration in designing a piezoelectric transformer, resulting in that a piezoelectric body can be more readily designed.

A further object of the present invention is to provide a piezoelectric transformer small in size and having a great step-up ratio without sacrificing a shape of a piezoelectric transformer.

A still further object of the present invention is to provide a support for supporting a piezoelectric transformer which accomplishes the above mentioned objects.

There is provided a piezoelectric transformer including (a) a piezoelectric body made of piezoelectric material and longitudinally defining a driven section and a voltage generating section, the piezoelectric body being cylindrical in shape, (b) a pair of input electrodes formed at a curved surface of the piezoelectric body in the driven section for receiving ac voltage to oscillate the piezoelectric body to cause the piezoelectric body to produce a voltage, and (c) an output electrode cooperating with one of the input electrodes to introduce the voltage therethrough.

There is further provided a piezoelectric transformer including (a) a cylindrical body made of piezoelectric material and longitudinally defining a driven section and a voltage generating section, the voltage generating section being polarized in one of directions in a direction of a longitudinal axis of the cylindrical body, (b) a pair of first electrodes formed at a curved surface of the cylindrical body in the driven section and defining a plurality of regions in the driven section in a direction of a longitudinal axis of the cylindrical body, the first electrodes being electrically isolated with each other, the regions being polarized so that every other regions are polarized in opposite directions in a direction of a longitudinal axis of the cylindrical body, and (c) a second electrode cooperating with one of the first electrodes located closer to the voltage generating section to make a pair therewith.

There is still further provided a piezoelectric transformer including (a) a cylindrical body made of piezoelectric material and longitudinally defining a driven section and a voltage generating section, the voltage generating section being polarized in one of directions in a direction of a longitudinal axis of the cylindrical body, (b) a pair of first electrodes formed at a curved surface of the cylindrical body in the driven section and defining a plurality of regions in the driven section in a direction of a longitudinal axis of the cylindrical body, the first electrodes being electrically isolated with each other, the regions being polarized so that every other regions are polarized in opposite directions in a direction of a longitudinal axis of the cylindrical body, the pair of first electrodes comprising a plurality of strip-shaped electrodes wound around the cylindrical body and disposed in parallel with one another in a direction of a longitudinal axis of the cylindrical body, every other strip-shaped electrodes being in electrical communication with one another so that they have a common voltage, and (c) a second electrode cooperating with one of the first electrodes located closer to the voltage generating section to make a pair therewith.

The strip-shaped electrodes may have the same width, and may be equally spaced with one another in a direction of a longitudinal axis of the cylindrical body.

It is preferable for the first electrodes to receive ac voltage having a frequency which causes longitudinal oscillation generated in the cylindrical body to make first or higher order resonance in the cylindrical body. The cylindrical body may have any diameter and/or height, but it is preferable that it has a diameter equal to a height thereof.

The first and second electrodes may be formed by curved-surface printing silver paste around the cylindrical body, and baking the silver paste.

The driven section may include one of end surfaces of the cylindrical body and the voltage generating section may include the other, and the second electrode may be formed at the other end surface of the cylindrical body. As an alternative, the second electrode may be formed at a curved surface and adjacent to the other end surface of the cylindrical body in place of being formed at the other end surface of the cylindrical body.

There is yet further provided a piezoelectric transformer including (a) a cylindrical body made of piezoelectric material and longitudinally defining a driven section and a voltage generating section, the voltage generating section being polarized in one of directions in a direction of a longitudinal axis of the cylindrical body, (b) a pair of first electrodes formed at a curved surface of the cylindrical body in the driven section and defining a plurality of regions in the driven section in a direction of a longitudinal axis of the cylindrical body, the first electrodes being electrically isolated with each other, the regions being polarized so that every other regions are polarized in opposite directions in a direction of a longitudinal axis of the cylindrical body, each of the pair of first electrodes including a plurality of finger electrodes wound circumferentially around the cylindrical body and disposed in parallel with one another in a direction of a longitudinal axis of the cylindrical body, the finger electrodes having ends spaced away from each other, and a connection electrode extending between the ends of finger electrodes of the associated first electrode in a direction of a longitudinal axis of the cylindrical body and connecting the finger electrodes thereto, the finger electrodes of the pair of first electrodes being alternately arranged in parallel with each other, and (c) a second electrode cooperating with one of the first electrodes located closer to the voltage generating section to make a pair therewith.

There is further provided a piezoelectric transformer including (a) a cylindrical body made of piezoelectric material and longitudinally defining a driven section and a voltage generating section, the voltage generating section being polarized in one of directions in a direction of a longitudinal axis of the cylindrical body, (b) a pair of first electrodes formed at a curved surface of the cylindrical body in the driven section and defining a plurality of regions in the driven section in a direction of a longitudinal axis of the cylindrical body, the first electrodes being electrically isolated with each other, the regions being polarized so that every other regions are polarized in opposite directions in a direction of a longitudinal axis of the cylindrical body, each of the pair of first electrodes comprising a spiral electrode, and (c) a second electrode cooperating with one of the first electrodes located closer to the voltage generating section to make a pair therewith.

There is further provided a piezoelectric transformer including (a) a cylindrical body made of piezoelectric material and longitudinally defining two driven sections and a voltage generating section sandwiched between the driven sections, each of the driven sections including an end surface of the cylindrical body, the voltage generating section being polarized in one of directions in a direction of a longitudinal axis of the cylindrical body, (b) two pairs of first electrodes each of which is formed at a curved surface of the cylindrical body in each of the driven sections and defines a plurality of regions in each of the driven sections in a direction of a longitudinal axis of the cylindrical body, the first electrodes in each of the pairs being electrically isolated with each other, the regions in each of the driven sections being polarized so that every other regions are polarized in opposite directions in a direction of a longitudinal axis of the cylindrical body, and (c) a second electrode formed in the voltage generating section, the second electrode cooperating with first electrodes located closer to the voltage generating section to make a pair therewith.

It is preferable that the regions in the driven sections are polarized symmetrically about the second electrode. The piezoelectric transformer may further include a plurality of lead wires for electrically connecting the piezoelectric transformer to an external terminal, the lead wires being connected to the piezoelectric transformer at nodes established in the cylindrical body when ac voltage is applied to the driven sections to thereby longitudinally oscillate the cylindrical body.

There is further provided a piezoelectric transformer including (a) a cylindrical body made of piezoelectric material and longitudinally defining two driven sections and a voltage generating section sandwiched between the driven sections, each of the driven sections including an end surface of the cylindrical body, the voltage generating section being polarized in one of directions in a direction of a longitudinal axis of the cylindrical body, (b) two pairs of first electrodes each of which is formed at a curved surface of the cylindrical body in each of the driven sections and defines a plurality of regions in each of the driven sections in a direction of a longitudinal axis of the cylindrical body, the first electrodes in each of the pairs being electrically isolated with each other, the regions in each of the driven sections being polarized so that every other regions are polarized in opposite directions in a direction of a longitudinal axis of the cylindrical body, each of the pairs of first electrodes comprising a plurality of strip-shaped electrodes wound around the cylindrical body and disposed in parallel with one another in a direction a longitudinal axis of the cylindrical body, every other strip-shaped electrodes being in electrical communication with one another so that they have a common voltage, and (c) a second electrode comprising a strip-shaped electrode wound around the cylindrical body at the longitudinal midpoint thereof, the second electrode cooperating with first electrodes located closer to the voltage generating section to make a pair therewith.

There is further provided a piezoelectric transformer including (a) a cylindrical body made of piezoelectric material and longitudinally defining two driven sections and a voltage generating section sandwiched between the driven sections, each of the driven sections including an end surface of the cylindrical body, the voltage generating section being polarized in one of directions in a direction of a longitudinal axis of the cylindrical body, (b) two pairs of first electrodes each of which is formed at a curved surface of the cylindrical body in each of the driven sections and defines a plurality of regions in each of the driven sections in a direction of a longitudinal axis of the cylindrical body, the first electrodes in each of the pairs being electrically isolated with each other, the regions in each of the driven sections being polarized so that every other regions are polarized in opposite directions in a direction of a longitudinal axis of the cylindrical body, each of the pairs of first electrodes comprising a plurality of finger electrodes wound circumferentially around the cylindrical body and disposed in parallel with one another in a direction of a longitudinal axis of the cylindrical body, the finger electrodes having ends spaced away from each other, and a connection electrode extending between the ends of finger electrodes of the associated first electrode in a direction of a longitudinal axis of the cylindrical body and connecting the finger electrodes thereto, the finger electrodes of the pair of first electrodes being alternately arranged in parallel with each other, and (c) a second electrode comprising a strip-shaped electrode wound around the cylindrical body at the longitudinal midpoint thereof, the second electrode cooperating with first electrodes located closer to the voltage generating section to make a pair therewith.

There is further provided a piezoelectric transformer including (a) a cylindrical body made of piezoelectric material and longitudinally defining two driven sections and a voltage generating section sandwiched between the driven sections, each of the driven sections including an end surface of the cylindrical body, (b) two pairs of first electrodes each of which is formed at a curved surface of the cylindrical body in each of the driven sections and defines a plurality of regions in each of the driven sections in a direction of a longitudinal axis of the cylindrical body, the first electrodes in each of the pairs being electrically isolated with each other, the regions in each of the driven sections being polarized so that every other regions are polarized in opposite directions in a direction of a longitudinal axis of the cylindrical body, each of the first electrodes comprising a spiral electrode, and (c) a second electrode comprising a strip-shaped electrode wound around the cylindrical body at the longitudinal midpoint thereof, the second electrode cooperating with first electrodes located closer to the voltage generating section to make a pair therewith.

There is further provided a support for supporting a piezoelectric transformer therewith. Herein, the piezoelectric transformer includes (a) a cylindrical body made of piezoelectric material longitudinally defining a driven section and a voltage generating section, (b) a pair of input electrodes formed at a curved surface of the cylindrical body in the driven section for receiving ac voltage to oscillate the cylindrical body to cause the cylindrical body to produce a voltage, and (c) an output electrode cooperating with one of the input electrodes to introduce the voltage therethrough. The support is made of resilient, electrically insulating material and supports the piezoelectric transformer at nodes established in the cylindrical body when ac voltage is applied to the driven section to thereby longitudinally oscillate the cylindrical body.

There is further provided a support for supporting a piezoelectric transformer therewith, including (a) an enclosure through which the cylindrical body can be inserted, and (b) resilient, electrically insulating material to be sandwiched between an inner surface of the enclosure and an outer surface of the cylindrical body.

The support may further include a housing in which the enclosure is fixed to the housing. The enclosure may be ring-shaped. The insulating material is preferably silicone resin. The support supports the piezoelectric transformer preferably at a longitudinal midpoint of the cylindrical body.

There is further provided a support for supporting a piezoelectric transformer therewith, including a plurality of supporting members made of resilient, electrically conductive material and supporting the piezoelectric transformer at the first and second electrodes therewith, the first and second electrodes being in electrical communication with an external terminal through the supporting members.

There is provided a support for supporting a piezoelectric transformer therewith, including (a) an enclosure made of electrically insulating material for enclosing the piezoelectric transformer therein, the enclosure being formed at an outer wall thereof with a plurality holes, and (b) resilient, electrically conductive material filled in the holes and making contact with the first electrodes, which are in electrical connection with an external terminal through the electrically conductive material.

There may be formed first and second sets of holes, each of the first and second sets of holes being formed in alignment with each of the first electrodes. The enclosure may have any shape. For instance, the enclosure may be rectangular or circular in shape. When the enclosure is formed to be rectangular in shape, the first and second sets of holes may be formed with each of planes of the enclosure facing each other, in which case, the resilient, electrically conductive material filled in the first and second sets of holes is in electrical connection with each other, respectively.

It is preferable that the planes make tangential contact with the cylindrical body.

In accordance with the present invention, a piezoelectric transformer has a cylindrical piezoelectric body. By applying an ac voltage to a driven section, there is produced an electric field having alternate polarities in a direction of a longitudinal axis of the cylindrical piezoelectric body. The regions polarized so that every other regions are polarized in opposite directions in a direction of a longitudinal axis of said cylindrical body are synchronized with the thus produced electric field, and thus there is produced a single longitudinal oscillation along a longitudinal axis of the cylindrical piezoelectric body. An ac voltage applied to the input electrodes is selected to have a frequency which causes the longitudinal oscillation generated in the piezoelectric body to make first or higher order resonance in the piezoelectric body. The thus induced oscillation in the piezoelectric body produces an ac voltage in the voltage generating section. The thus produced ac voltage is higher than and has the same frequency as the ac voltage applied to the driven section The thus produced step-up ac voltage is obtained through the electrode formed at the voltage generating section.

The cylindrical piezoelectric body in the present invention has edges only in opposite bottom surfaces thereof. Since the cylindrical piezoelectric body had the smaller number of edges than a planar piezoelectric body, the possibility of occurrence of chipping is smaller. In addition, edges of bottom surfaces of the cylindrical piezoelectric body are not parts where a tensile stress is generated. Hence, even if an edge of the cylindrical piezoelectric body is chipped, there is quite small possibility of complete destruction of a piezoelectric transformer. Thus, higher reliability is ensured than a conventional piezoelectric transformer. In addition, a piezoelectric transformer in accordance with the present invention can be more readily treated in fabrication process, resulting in enhancement in fabrication efficiency and non-defectiveness rate, which reduces the fabrication costs of a piezoelectric transformer.

Oscillation modes readily produced in a cylindrical piezoelectric body is simpler than those produced in a planar piezoelectric body. The primary oscillation mode is a longitudinal oscillation in a direction of a longitudinal axis of a cylindrical piezoelectric body, and the secondary mode is bending oscillation. Torsional oscillation needs much energy to be produced, and hence there is scarcely produced a great level of torsional oscillation. The bending oscillation can be produced more readily than torsional oscillation, but needs much more energy to be produced than a bending of a planar plate having the same cross-sectional area. Hence, even if the bending oscillation would be produced as unnecessary oscillation mode, the oscillation level is smaller than that of a planar piezoelectric body. Thus, a cylindrical piezoelectric body in accordance with the present invention has quite smaller possibility than a planar piezoelectric body in terms of production of noises exerting harmful influence on audible frequency.

As well known in those skilled in the art, the electric power a piezoelectric transformer can deal with is in proportion to a cross-sectional area through which oscillation of a piezoelectric transformer is propagated, as first order approximation. The cylindrical piezoelectric body used in a piezoelectric transformer in accordance with the present invention has a greater cross-sectional area than that of a piezoelectric body used in a piezoelectric transformer disclosed in the above mentioned U.S. Pat. No. 2,974,296. Accordingly, the present invention provides a piezoelectric transformer smaller in size, but having a greater step-up ratio. In particular, if the cylindrical piezoelectric body is designed to have a diameter equal to a height thereof, such a geometry is quite advantageous for certain applications in comparison with a planar piezoelectric body.

A support in accordance with the present invention ensures that a piezoelectric transformer can be readily supported by a simply structured support without reduction in transformation efficiency of a piezoelectric transformer.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 1A:
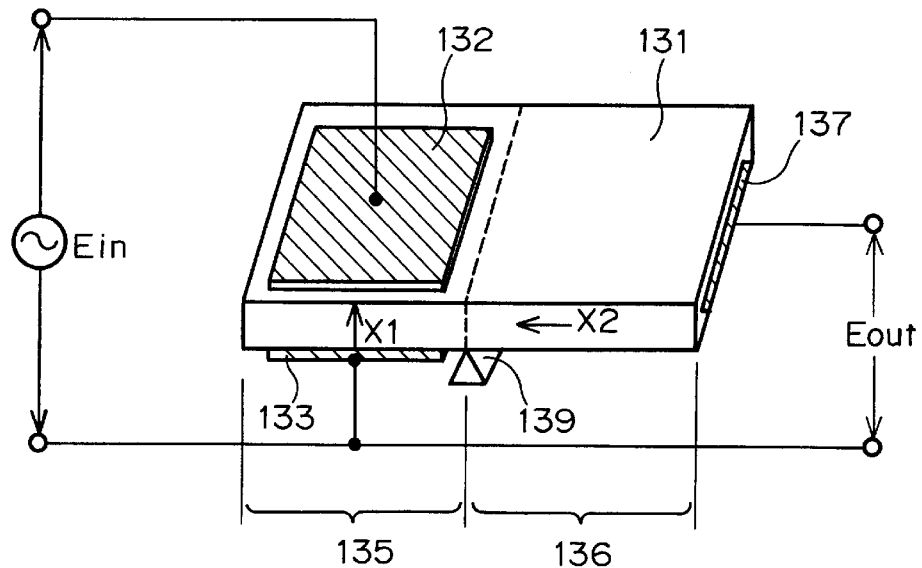
FIG. 1A is a schematic, perspective view illustrating a conventional piezoelectric transformer.
Figure 1B:
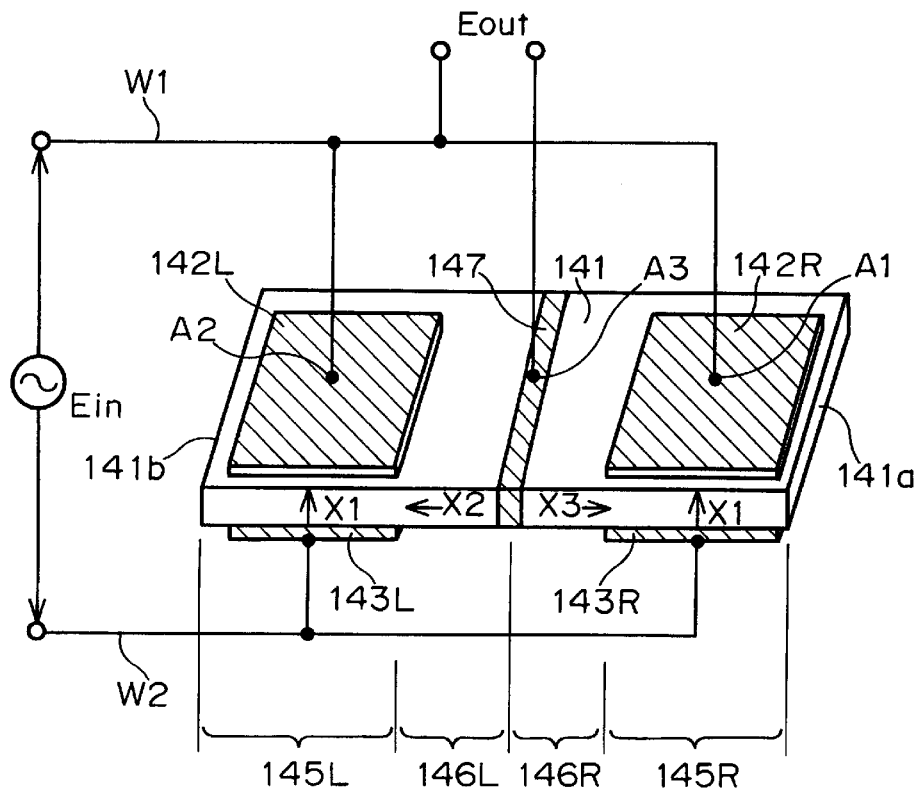
FIG. 1B is a schematic, perspective view illustrating another conventional piezoelectric transformer.
Figure 2:
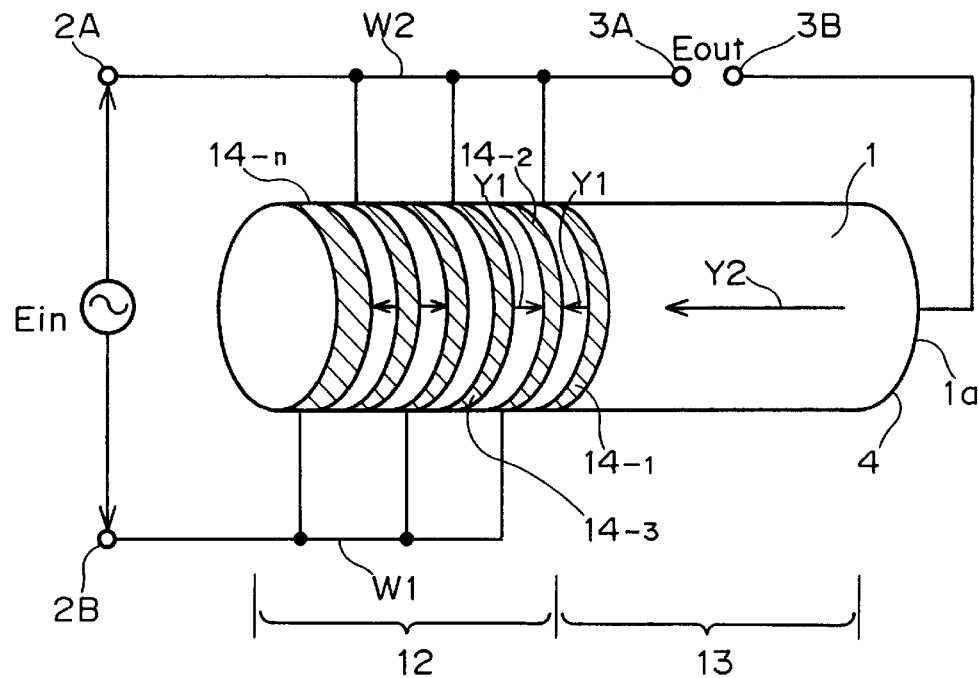
FIG. 2 is a schematic, perspective view illustrating a piezoelectric transformer in accordance with the first embodiment of the present invention.

With reference to FIG. 2, a piezoelectric body 1 is formed by shaping piezoelectric ceramic material available from Kabushiki Kaisha Tokin, Japan, under the tradename of Nepec 8, baking the material, and finishing it to a cylinder having a diameter of 2.5 mm and a length of 42 mm. The cylindrical piezoelectric body 1 includes two sections: a driven section 12 and a voltage generating section 13 defined in a direction of a longitudinal axis of the piezoelectric body 1. The piezoelectric body 1 includes the n number of strip-shaped electrodes 14-1 to 14-n wound therearound in the driven section 12. The strip-shaped electrodes 14-1 to 14-n have the same width and are equally spaced away from one another in a direction of a longitudinal axis of the cylindrical piezoelectric body 1. The cylindrical piezoelectric body 1 is formed at an end or bottom surface 1a with an electrode 4 in the voltage generating section 13. The electrodes 14-1 to 14-n and 4 are formed by printing silver paste on a curved surface and the end surface 1a of the cylindrical piezoelectric body 1, and baking the silver paste. Each of the electrodes 14-1 to 14-n and 4 has a thickness of about 15 $\mu$m.

After the formation of the electrodes 14-1 to 14-n and 4, the i-th electrodes are connected with one another through a lead wire W1 wherein i is an odd number, and the k-th electrodes are connected with one another through a lead wire W2 wherein k is an even number so that every other electrodes are in the same voltage. That is, the electrodes 14-1, 14-3, 14-5,—are electrically connected with one another and further to a terminal 2A through the lead wire W1, and the electrodes 14-2, 14-4, 14-6,—are electrically connected with one another and further to a terminal 2B through the lead wire W2 in order to polarize the driven section 12. Polarization is accomplished by applying a dc field in the range of 2 to 3 kV per 1 mm of a space between the adjacent strip-shaped electrodes to the strip-shaped electrodes in silicone oil heated in the range of 100° C. to 200° C. By accomplishing the polarization, regions between the adjacent strip-shaped electrodes are polarized so that every other regions is polarized in opposite directions in a direction of a longitudinal axis of the cylindrical piezoelectric body 1, as indicated with shorter arrows Y1.

Then, the voltage generating section 13 is polarized. A dc field is applied across the electrode 4 formed on the end surface 1a and a strip-shaped electrode located closest to the voltage generating section 13, namely the strip-shaped electrode 14-1. The conditions for polarization are the same as those for polarization of the driven section 12. As a result, the voltage generating section 13 is polarized in a direction of a longitudinal axis of the cylindrical piezoelectric body 1, as indicated with a longer arrow Y2.

The strip-shaped electrode located closest to the voltage generating section 13 or the strip-shaped electrode 14-1 is electrically connected to a terminal 3A, and the end surface electrode 4 is electrically connected to a terminal 3B. The terminals 3A and 3B cooperate with each other to define an output port, as mentioned later.

In order to operate a piezoelectric transformer in accordance with the instant embodiment, an ac voltage Ein is applied across the terminal 2A connecting to the i-th number strip-shaped electrodes wherein i is an odd number and the terminal 2B connecting to the k-th number strip-shaped electrodes wherein k is an even number. The ac voltage Ein has a frequency of 38 kHz. By applying the ac voltage to the strip-shaped electrodes 14-1 to 14-n, distortion is repeatedly produced through an electromechanical coupling factor $k_{33}$ along a longitudinal axis of the cylindrical piezoelectric body 1. As a result, resonant longitudinal oscillation is generated in the piezoelectric body 1 in a direction of a longitudinal axis of the cylindrical piezoelectric body 1 with the end surface 1a being as an open end. The thus generated resonant longitudinal oscillation produces a voltage in the voltage generating section 13 through the electromechanical coupling factor $k_{33}$ between the end surface electrode 4 and the strip-shaped electrode 14-1. The thus produced voltage Eout is obtained through the terminals 3A and 3B.

In the instant embodiment, each of the strip-shaped electrodes 14-1 to 14-n had a width of 0.2 mm, and the adjacent strip-shaped electrodes were spaced away from each other by 0.8 mm. The piezoelectric transformer in accordance with the instant embodiment could deal with electric power of about 2 W. The step-up ratio which is defined as Eout/Ein was about 30.

In the instant embodiment, the maximum tensile stress is generated in the vicinity of the strip-shaped electrode 14-1. There was conducted a test for a sufficient number of piezoelectric transformers in accordance with the above mentioned embodiment. In the test, after the piezoelectric transformers were treated in fabrication process with care which would be usually taken for treating ceramics, they were experimentally operated with electric power of about 5 W. The result was that destruction never occurred in all of the tested piezoelectric transformers.

The audible noises were below 25 dB at a distance of 5 cm away from the tested piezoelectric transformer, which poses no problem in practical use.

[Second Embodiment]

Figure 3:
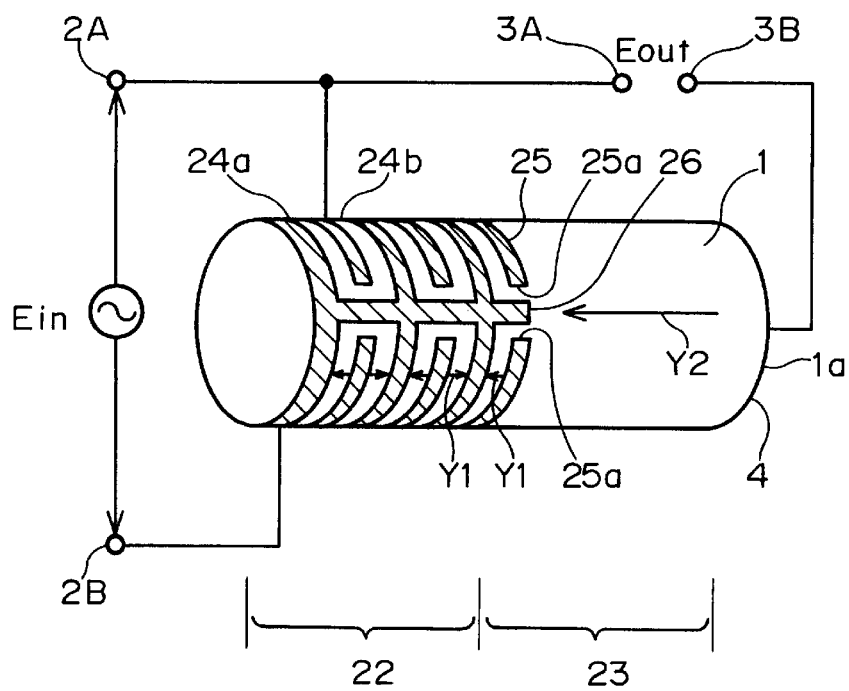
FIG. 3 is a schematic, perspective view illustrating a piezoelectric transformer in accordance with the second embodiment of the present invention.

FIG. 3 illustrates a piezoelectric transformer in accordance with the second embodiment. The second embodiment is different from the first embodiment in shape of electrodes in a driven section and how a driven section is polarized.

Similarly to the first embodiment, the cylindrical piezoelectric body 1 includes two sections: a driven section 22 and a voltage generating section 23 defined in a direction of a longitudinal axis of the piezoelectric body 1. There are formed a pair of first electrodes 24a and 24b on a curved surface of the cylindrical piezoelectric body in the driven section 22. Each of the first electrodes 24a and 24b includes a plurality of finger electrodes 25 wound circumferentially around the piezoelectric body 1 and disposed in parallel with one another in a direction of a longitudinal axis of the piezoelectric body 1. Each of the finger electrodes 25 has ends 25a spaced away from each other by a certain distance. The finger electrodes 25 have the same width and are equally spaced away from each other. Each of the first electrodes 24a and 24b further includes a connection electrode 26 extending between the ends 25a of the finger electrodes 25 of the associated first electrode in a direction of a longitudinal axis of the piezoelectric body 1 and connecting the finger electrodes 25 thereto. The finger electrodes 25 of each of the first electrodes 24a and 24b are alternately arranged in parallel with each other.

Similarly to the first embodiment, the cylindrical piezoelectric body 1 is formed at an end or bottom surface 1a with an electrode 4 in the voltage generating section 23. The electrodes 24a, 24b and 4 are formed by printing silver paste on a curved surface and the end surface 1a of the cylindrical piezoelectric body 1, and baking the silver paste. Each of the electrodes 24a, 24b and 4 has a thickness of about 15 $\mu$m.

After the formation of the electrodes 24a, 24b and 4, the driven section 22 is polarized. Polarization is accomplished by applying a dc field in the range of 2 to 3 kV per 1 mm of a space between the adjacent finger electrodes to the first electrodes 24a and 24b in silicone oil heated in the range of 100° C. to 200° C. By accomplishing the polarization, regions sandwiched the finger electrodes 25 are polarized so that every other regions is polarized in opposite directions in a direction of a longitudinal axis of the cylindrical piezoelectric body 1, as indicated with shorter arrows Y1.

Then, the voltage generating section 23 is polarized. Before accomplishing polarization, the first electrodes 24a and 24b are electrically connected with each other through a wire to thereby have the same voltage. Thereafter, a dc field is applied across the electrode 4 formed on the end surface 1a and the first electrodes 24a, 24b kept in the same voltage. The conditions for polarization are the same as those for polarization of the driven section 22. As a result, the voltage generating section 23 is polarized in a direction of a longitudinal axis of the cylindrical piezoelectric body 1, as indicated with a longer arrow Y2.

When the piezoelectric body 1 was designed to have the same dimensions as the piezoelectric body 1 in the first embodiment, each of the finger electrodes 25 was designed to have a width of 0.2 mm, and the adjacent finger electrodes 25 were designed to be spaced away from each other by 0.8 mm, the piezoelectric transformer in accordance with the instant embodiment could deal with electric power of about 2 W. The step-up ratio was about 25. There never happened chipping or destruction of a piezoelectric transformer, and there were never produced audible noises which would pose a problem in practical use.

In the second embodiment, the finger electrodes 25 are polarized not only in a direction of a longitudinal axis of the piezoelectric body 1, but also unpreferably in a circumferential direction at the ends 25a thereof. However, when the first electrodes 24a and 24b are formed, the finger electrodes 25 are electrically connected with one another in advance by printing so that they are in the same voltage, and hence it is no longer necessary to electrically connect them in another step unlike the first embodiment in which i-th and k-th strip-shaped electrodes are electrically connected with one another through wires W1 and W2, respectively, wherein i and k are odd and even numbers, respectively. Thus, the second embodiment ensures simpler fabrication process than that of the first embodiment.

[Third Embodiment]

Figure 4:
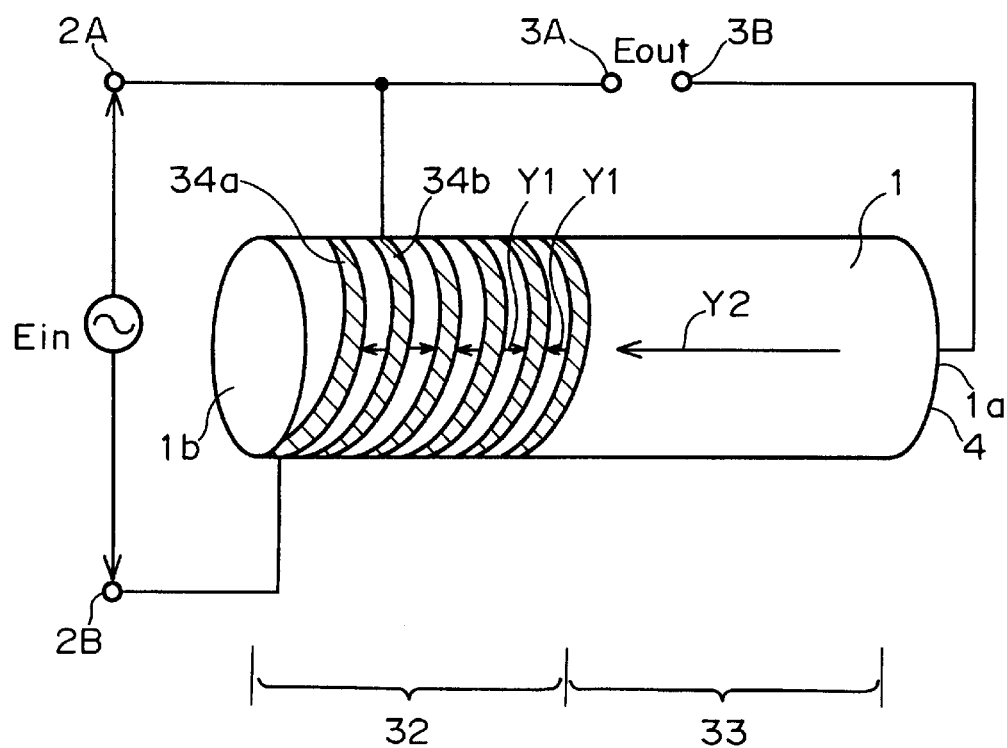
FIG. 4 is a schematic, perspective view illustrating a piezoelectric transformer in accordance with the third embodiment of the present invention.

FIG. 4 illustrates a piezoelectric transformer in accordance with the third embodiment. The third embodiment is different from the first embodiment in shape of electrodes in a driven section and how a driven section is polarized.

Similarly to the first embodiment, the cylindrical piezoelectric body 1 includes two sections: a driven section 32 and a voltage generating section 33 defined in a direction of a longitudinal axis of the piezoelectric body 1. In the driven section 32, there are formed a pair of spiral electrodes 34a and 34b equally spaced away from each other. Specifically, the first spiral electrode 34a is a thin strip electrode, and starts at an end surface 1b of the piezoelectric body 1 and spirally extends around a curved surface of the piezoelectric body 1. The second spiral electrode 34b is also a thin strip electrode, and extends around a curved surface of the piezoelectric body 1 intermediate between the first spiral electrode 34a.

Similarly to the first and second embodiments, the cylindrical piezoelectric body 1 is formed at an end or bottom surface 1a with an electrode 4 in the voltage generating section 33. The electrodes 34a, 34b and 4 are formed by printing silver paste on a curved surface and the end surface 1a of the cylindrical piezoelectric body 1, and baking the silver paste. Each of the electrodes 34a, 34b and 4 has a thickness of about 15 $\mu$m.

After the formation of the electrodes 34a, 34b and 4, the driven section 32 is polarized. Polarization is accomplished by applying a dc field in the range of 2 to 3 kV per 1 mm of a space between the adjacent spiral electrodes to the spiral electrodes 34a and 34b in silicone oil heated in the range of 100° C. to 200° C. By accomplishing the polarization, regions sandwiched the first and second spiral electrodes 34a and 34b are polarized so that every other regions is polarized in opposite directions in a direction of a longitudinal axis of the cylindrical piezoelectric body 1, as indicated with shorter arrows Y1.

Then, the voltage generating section 33 is polarized. Before accomplishing polarization, the first and second spiral electrodes 34a and 34b are electrically connected with each other through a wire to thereby have the same voltage. Thereafter, a dc field is applied across the electrode 4 formed on the end surface 1a and both of the spiral electrodes 34a, 34b kept in the same voltage. The conditions for polarization are the same as those for polarization of the driven section 32. As a result, the voltage generating section 33 is polarized in a direction of a longitudinal axis of the cylindrical piezoelectric body 1, as indicated with a longer arrow Y2.

In order to operate the piezoelectric transformer in accordance with the instant embodiment, an ac voltage having a frequency of about 38 kHz is applied across the spiral electrodes 34a and 34b. When the spiral electrodes 34a and 34b were designed to have a line width of 0.2 mm, and the adjacent spiral electrodes 34a and 34b were designed to be spaced away from each other by 0.8 mm, the piezoelectric transformer in accordance with the instant embodiment could deal with electric power of about 2 W. The step-up ratio was about 27. There never happened chipping or destruction of a piezoelectric transformer, and there were never produced audible noises which would pose a problem in practical use.

[Fourth Embodiment]

Figure 5:
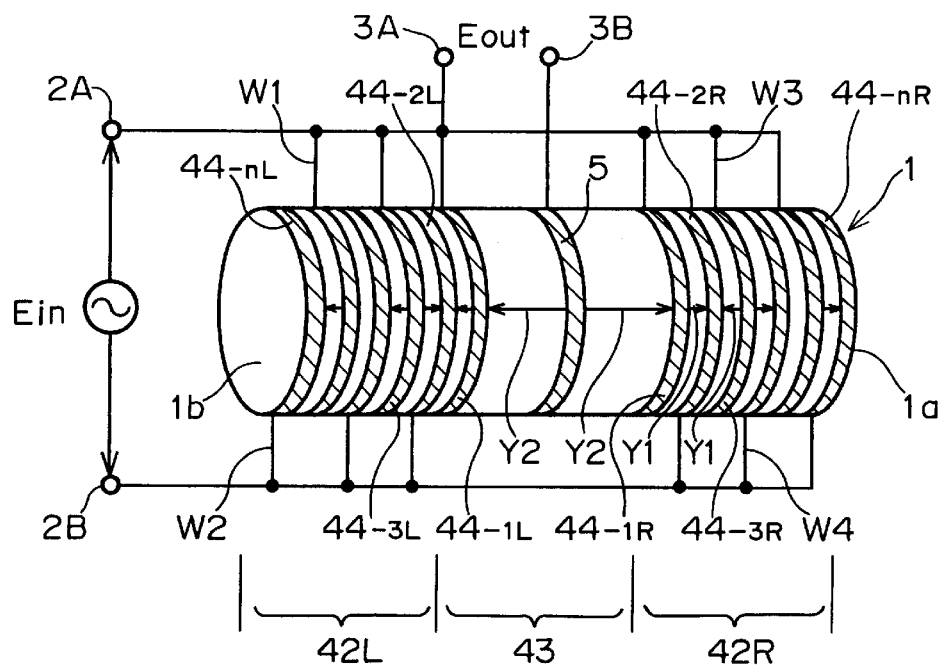
FIG. 5 is a schematic, perspective view illustrating a piezoelectric transformer in accordance with the fourth embodiment of the present invention.

FIG. 5 illustrates a piezoelectric transformer in accordance with the fourth embodiment of the present invention. The illustrated piezoelectric transformer has a cylindrical piezoelectric body 1. The piezoelectric body 1 is formed by shaping piezoelectric ceramic material available from Kabushiki Kaisha Tokin, Japan, under the tradename of Nepec 8, baking the material, and finishing it into a cylinder having a diameter of 2.5 mm and a length of 42 mm. The cylindrical piezoelectric body 1 defines three sections in a direction of a longitudinal axis of the piezoelectric body 1: a first driven section 42L including an end surface 1b of the cylindrical piezoelectric body 1; a second driven section 42R including the other end surface 1a of the cylindrical piezoelectric body 1; and a voltage generating section 43 sandwiched between the driven sections 42L and 42R.

The piezoelectric body 1 includes the n number of strip-shaped electrodes 44-1L to 44-nL wound therearound in the first driven section 42L. The strip-shaped electrodes 44-1L to 44-nL have the same width and are equally spaced away from one another in a direction of a longitudinal axis of the cylindrical piezoelectric body 1. In the same way, the piezoelectric body 1 also includes the n number of strip-shaped electrodes 44-1R to 44-nR wound therearound in the second driven section 42R.

An electrode 5 is wound around the cylindrical piezoelectric body 1 at the center of the voltage generating section 43. The electrodes 44-1L to 44nL, 44-1R to 44-nR and 5 are formed by printing silver paste on a curved surface of the cylindrical piezoelectric body 1, and baking the silver paste. Each of the electrodes has a thickness of about 15 $\mu$m.

After the formation of the electrodes 44-1L to 44-nL, 44-1R to 44-nR and 5, the first and second driven sections 42L and 42R are polarized. For polarization, the strip-shaped electrodes are electrically connected with one another as follows. In the first driven section 42L, the i-th electrodes are connected with one another through a lead wire W1 wherein i is an odd number, and the k-th electrodes are connected with one another through a lead wire W2 wherein k is an even number so that every other electrodes are in the same voltage. Herein, strip-shaped electrodes located nearest the voltage generating section 43 are selected to be the first electrodes 44-1L and 44-1R. Similarly, in the second driven section 42R, the i-th electrodes are connected with one another through a lead wire W3 wherein i is an odd number, and the k-th electrodes are connected with one another through a lead wire W4 wherein k is an even number so that every other electrodes are in the same voltage. That is, the electrodes 44-1L, 44-3L, 44-5L,—and 44-1R, 44-3R, 44-5R,—are electrically connected with one another and further to a terminal 2A through the lead wires W1 and W3, respectively, and the electrodes 44-2L, 44-4L, 44-6L,—and 44-2R, 44-4R, 44-6R,—are electrically connected with one another and further to a terminal 2B through the lead wires W2 and W4, respectively.

Polarization is accomplished by applying a dc field in the range of 2 to 3 kV per 1 mm of a space between the adjacent strip-shaped electrodes to the strip-shaped electrodes in silicone oil heated in the range of 100° C. to 200° C. By accomplishing the polarization, regions between the adjacent strip-shaped electrodes are polarized so that every other regions is polarized in opposite directions in a direction of a longitudinal axis of the cylindrical piezoelectric body 1, as indicated with shorter arrows Y1. In addition, regions between the adjacent strip-shaped electrodes in the first driven section 42L are symmetrically polarized with regions between the adjacent strip-shaped electrodes in the second driven section 42R about the electrode 5 formed in the voltage generating section 43.

Then, the voltage generating section 43 is polarized as follows. The lead wires W1 and W3 are electrically connected with each other so that the strip-shaped electrode 44-1L located closest to the voltage generating section 43 among the strip-shaped electrodes 44-1L to 44-nL in the first driven section 42L and the strip-shaped electrode 44-1R located closest to the voltage generating section 43 among the strip-shaped electrodes 44-1R to 44-nR in the second driven section 42R are in the same voltage. Then, a dc field is applied across the electrode 5 and the strip-shaped electrodes 44-1L and 44-1R kept in the same voltage. The conditions for polarization are the same as those for polarization of the driven sections 42L and 42R. As a result, the voltage generating section 43 is polarized in opposite directions symmetrically about the electrode 5 in a direction of a longitudinal axis of the cylindrical piezoelectric body 1, as indicated with longer arrows Y2.

The strip-shaped electrodes located closest to the voltage generating section 43 or the strip-shaped electrodes 44-1L and 44-1R are electrically connected to a terminal 3A, and the electrode 5 is electrically connected to a terminal 3B. The terminals 3A and 3B cooperate with each other to define an output port.

In order to operate a piezoelectric transformer in accordance with the instant embodiment, an ac voltage Ein is applied across the terminal 2A connecting to the i-th number strip-shaped electrodes 44-1L, 44-3L,—and 44-1R, 44-3R, —wherein i is an odd number and the terminal 2B connecting to the k-th number strip-shaped electrodes 44-2L, 44-4L, —and 44-2R, 44-4R,—wherein k is an even number. The ac voltage Ein has a frequency of 112 kHz. By applying the ac voltage to the strip-shaped electrodes, distortion is repeatedly produced through an electromechanical coupling factor $k_{33}$ along a longitudinal axis of the cylindrical piezoelectric body 1. As a result, resonant longitudinal oscillation is generated in the piezoelectric body 1 in a direction of a longitudinal axis of the cylindrical piezoelectric body 1. The thus generated oscillation is of tertiary oscillation mode. That is, the end surfaces 1a and 1b of the cylindrical piezoelectric body 1 act as open ends, and thereby make loops of the oscillation. Supposing the cylindrical piezoelectric body 1 is divided into six sections, there are generated three nodal points of the oscillation between first and second sections, between third and fourth sections, and between fifth and sixth sections.

The above mentioned resonant longitudinal oscillation produces voltages through the electromechanical coupling factor $k_{33}$ between the electrode 5 and the strip-shaped electrode 44-1L and also between the electrode 5 and the strip-shaped electrode 44-1R. The thus produced voltages are obtained through the terminals 3A and 3B as an output voltage Eout.

When the strip-shaped electrodes were designed to have a line width of 0.2 mm, and the adjacent electrodes were designed to be spaced away from each other by 0.8 mm, the piezoelectric transformer in accordance with the instant embodiment could deal with electric power of about 2 W. The step-up ratio was about 20, which was lower than the step-up ratios in the first to third embodiments. However, if a load having a relatively low impedance (for instance, a cold cathode fluorescent light to be used for liquid crystal back light of a note type personal computer has an impedance of about 70 kΩ during turned on) is driven by the piezoelectric transformer in accordance with the first embodiment, a step-up ratio is reduced down to about 10. In contrast, if driven by a piezoelectric transformer in accordance with the fourth embodiment, the step-up ratio is not reduced, but kept to be at about 20. This is because a piezoelectric transformer in accordance with the fourth embodiment has lower output impedance than that of the first to third embodiments.

In the instant embodiment, the maximum tensile stress is generated in the vicinity of the electrode 5. There was conducted a test for a sufficient number of piezoelectric transformers in accordance with the instant embodiment. In the test, after the piezoelectric transformers were treated in fabrication process with care which would be usually taken for treating ceramics, they were experimentally operated with electric power of about 5 W. The result was that chipping never occurred in all of the tested piezoelectric transformers.

The audible noises were below 25 dB at a distance of 5 cm away from the tested piezoelectric transformer, which poses no problem in practical use.

As mentioned earlier, the three nodal points of oscillation are generated in a direction of a longitudinal axis of the piezoelectric body 1. Thus, by connecting the piezoelectric body 1 to an external terminal through lead wires at the nodal points, it is possible to readily support a piezoelectric transformer and enhance reliability in connection of a piezoelectric transformer to an external terminal through lead wires. In addition, as mentioned earlier, since a piezoelectric transformer in accordance with the instant embodiment has a lower output impedance, it is possible to have a higher step-up ratio for a load having a smaller impedance.

[Fifth Embodiment]

Figure 6:
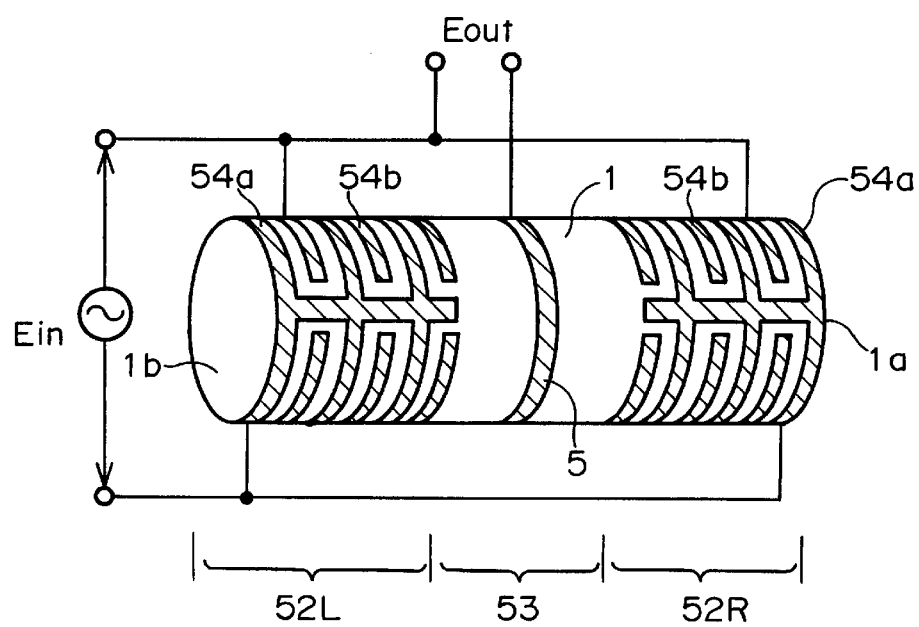
FIG. 6 is a schematic, perspective view illustrating a piezoelectric transformer in accordance with the fifth embodiment of the present invention.

FIG. 6 illustrates a piezoelectric embodiment in accordance with the fifth embodiment. In the above mentioned fourth embodiment illustrated in FIG. 5, the strip-shaped electrodes 14-1 to 14-n in accordance with the first embodiment illustrated in FIG. 2 are applied to a piezoelectric transformer as electrodes to be formed in the first and second driven sections 42L and 42R. The same can be done for a piezoelectric transformer in accordance with the second embodiment illustrated in FIG. 3.

As illustrated in FIG. 6, a piezoelectric transformer in accordance with the fifth embodiment has a cylindrical piezoelectric body 1 defining three sections in a direction of a longitudinal axis of the piezoelectric body 1: a first driven section 52L including an end surface 1b of the cylindrical piezoelectric body 1; a second driven section 52R including the other end surface 1a of the cylindrical piezoelectric body 1; and a voltage generating section 53 sandwiched between the driven sections 52L and 52R.

In each of the driven sections 52L and 52R, there are formed a pair of electrodes 54a and 54b equally spaced away from each other. Those electrodes 54a and 54b are the same as the electrodes 24a and 24b as illustrated in FIG. 3.

An electrode 5 is wound around the cylindrical piezoelectric body 1 at the center of the voltage generating section 53.

The polarization of the driven sections 52L, 52R and the voltage generating section 53 is accomplished in the same way as that of the second embodiment.

The thus obtained piezoelectric transformer in accordance with the fifth embodiment provides the same advantages as those of the fourth embodiment.

[Sixth Embodiment]

Figure 7:
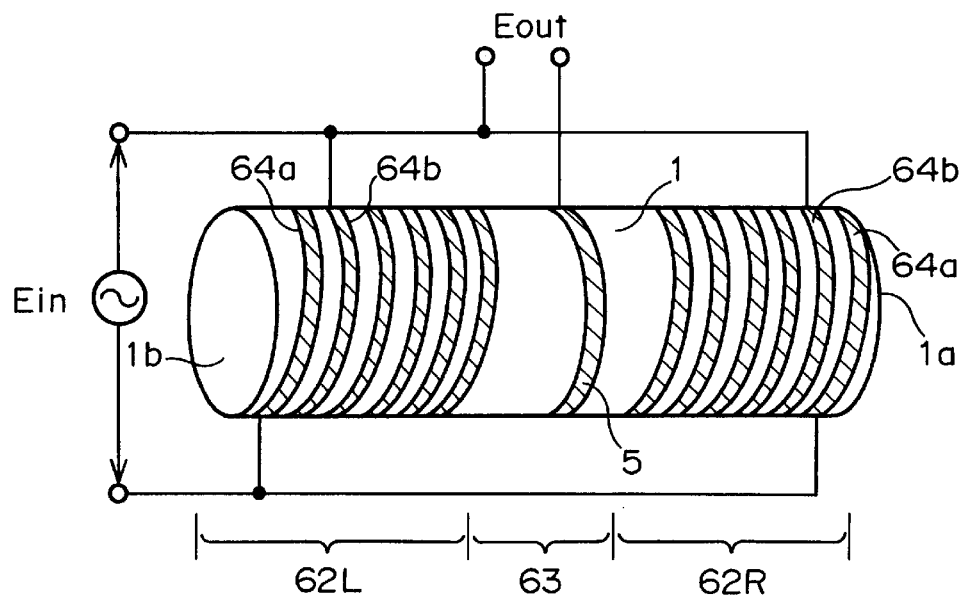
FIG. 7 is a schematic, perspective view illustrating a piezoelectric transformer in accordance with the sixth embodiment of the present invention.

FIG. 7 illustrates a piezoelectric embodiment in accordance with the sixth embodiment. As illustrated in FIG. 7, a piezoelectric transformer in accordance with the sixth embodiment has a cylindrical piezoelectric body 1 defining three sections in a direction of a longitudinal axis of the piezoelectric body 1: a first driven section 62L including an end surface 1b of the cylindrical piezoelectric body 1; a second driven section 62R including the other end surface 1a of the cylindrical piezoelectric body 1; and a voltage generating section 63 sandwiched between the driven sections 62L and 62R.

In each of the driven sections 62L and 62R, there are formed a pair of spiral electrodes 64a and 64b equally spaced away from each other. Those spiral electrodes 64a and 64b are the same as the spiral electrodes 34a and 34b as illustrated in FIG. 4.

An electrode 5 is wound around the cylindrical piezoelectric body 1 at the center of the voltage generating section 63.

The polarization of the driven sections 62L, 62R and the voltage generating section 63 is accomplished in the same way as that of the third embodiment.

The thus obtained piezoelectric transformer in accordance with the sixth embodiment provides the same advantages as those of the fourth embodiment.

[Seventh Embodiment]

Figure 8:
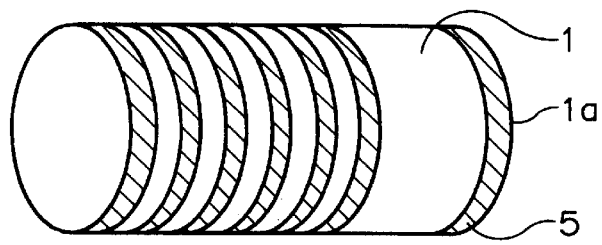
FIG. 8 is a schematic, perspective view illustrating a piezoelectric transformer in accordance with the seventh embodiment of the present invention.

FIG. 8 illustrates a piezoelectric embodiment in accordance with the seventh embodiment. In the piezoelectric transformer in accordance with the first embodiment as illustrated in FIG. 2, the electrode 4 for the voltage generating section 13 is formed on the end surface 1a of the cylindrical piezoelectric body 1. In contrast, an electrode 5 for a voltage generating section is formed at a curved surface and adjacent to an end surface 1a of a cylindrical piezoelectric body 1.

Comparing to a piezoelectric transformer in accordance with the first embodiment in which the electrode 4 is formed on the end surface 1a of the piezoelectric body 1, a piezoelectric transformer in accordance with the seventh embodiment shows a tendency that a step-up ratio becomes smaller for a shorter length of the piezoelectric body 1. However, when a piezoelectric transformer in accordance with the seventh embodiment is designed to have a length of 42 mm and a diameter of 2.5 mm, there is almost no difference in a step-up ratio between the first and seventh embodiment. The seventh embodiment provides an advantage that the electrodes may be formed by the smaller number of printing than the first embodiment with the result of reduction in fabrication costs.

[Eighth Embodiment]

Figure 9:
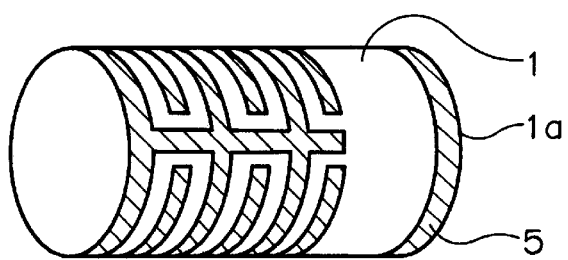
FIG. 9 is a schematic, perspective view illustrating a piezoelectric transformer in accordance with the eighth embodiment of the present invention.

FIG. 9 illustrates a piezoelectric embodiment in accordance with the eighth embodiment. A piezoelectric transformer in accordance with the instant embodiment is different from the second embodiment as illustrated in FIG. 3 in that an electrode 5 for a voltage generating section is formed at a curved surface and adjacent to an end surface 1a of a cylindrical piezoelectric body 1. Electrodes formed in a driven section are the same as the electrodes 24a and 24b in the second embodiment. The piezoelectric transformer in accordance with the eighth embodiment provides the same advantages as those of the seventh embodiment.

[Ninth Embodiment]

Figure 10:
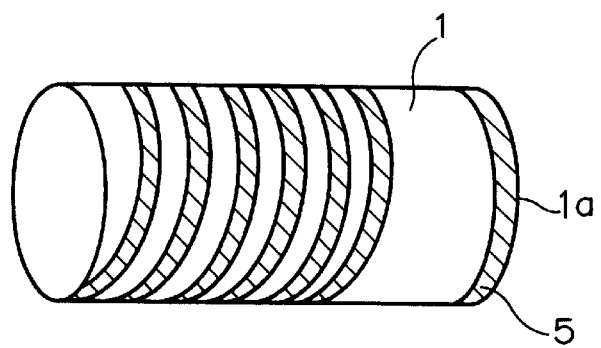
FIG. 10 is a schematic, perspective view illustrating a piezoelectric transformer in accordance with the ninth embodiment of the present invention.

FIG. 10 illustrates a piezoelectric embodiment in accordance with the ninth embodiment. A piezoelectric transformer in accordance with the instant embodiment is different from the third embodiment as illustrated in FIG. 4 in that an electrode 5 for a voltage generating section is formed at a curved surface and adjacent to an end surface 1a of a cylindrical piezoelectric body 1. Electrodes formed in a driven section are the same as the spiral electrodes 34a and 34b in the third embodiment. The piezoelectric transformer in accordance with the ninth embodiment provides the same advantages as those of the seventh embodiment.

[Tenth Embodiment]

Figure 11:
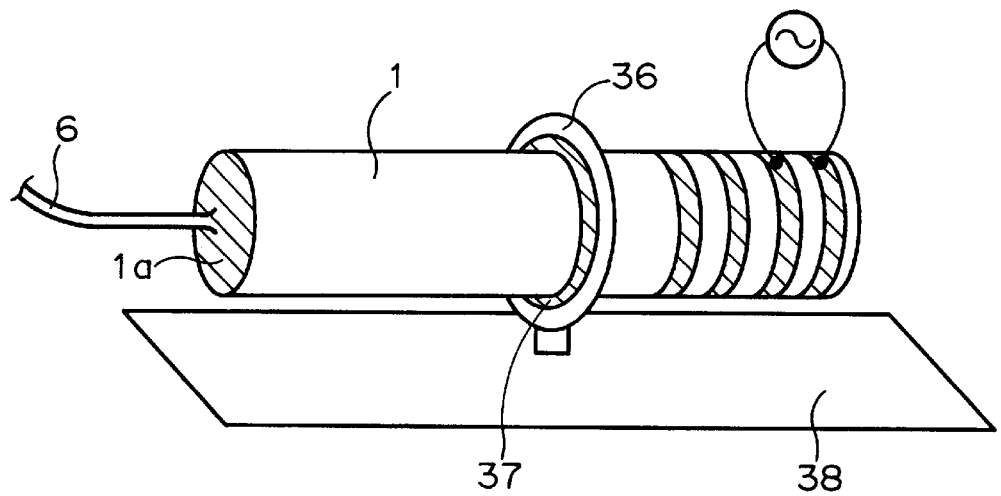
FIG. 11 is a schematic, perspective view illustrating a support in accordance with the tenth embodiment of the present invention for supporting a piezoelectric transformer.

FIG. 11 illustrates a support in accordance with an embodiment of the present invention. The illustrated support is for supporting a piezoelectric transformer in accordance with the first embodiment as illustrated in FIG. 2.

The support includes a ring 36 having a greater diameter than a diameter of a cylindrical piezoelectric body 1 of the piezoelectric transformer, and electrically insulating, resilient silicone resin 37 sandwiched between an inner surface of the ring 36 and an outer surface of the piezoelectric body 1. The cylindrical piezoelectric body 1 is supported at the midpoint thereof by being inserted into the ring 36 with the silicone resin 37 fixing the piezoelectric body 1 in place. The ring 36 is fixed to a housing 38 (partially illustrated) in which the piezoelectric transformer is entirely placed. A thin lead wire 6 is soldered to an end surface 1a of the cylindrical piezoelectric body 1 for therethrough taking an output voltage generated by the piezoelectric transformer.

There was conducted a test for evaluating the above mentioned piezoelectric transformer fixed in the housing 38 with respect to transformation efficiency in comparison with a piezoelectric transformer not fixed in the housing. The result was that the transformation efficiencies were almost the same for both of the piezoelectric transformers.

Any enclosure may be employed in place of the ring 36, unless the piezoelectric body 1 can be inserted into the enclosure. Similarly, any resilient, electrically insulating material may be used in place of the silicone resin 37.

[Eleventh Embodiment]

Figure 12A:
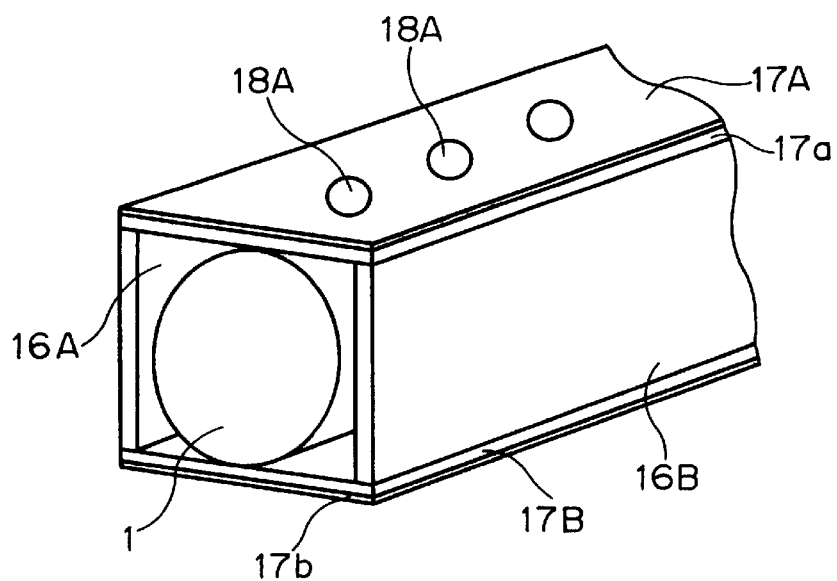
FIG. 12A is a schematic, perspective view illustrating a support in accordance with the eleventh embodiment of the present invention for supporting a piezoelectric transformer.
Figure 12B:
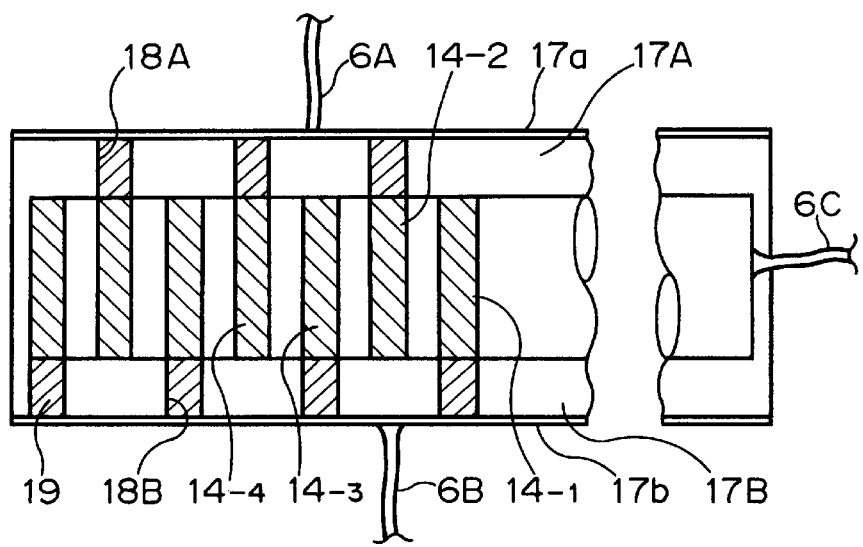
FIG. 12B is a cross-sectional view of the support illustrated in FIG. 12A and a piezoelectric transformer supported by the support.

FIGS. 12A and 12B illustrate a support in accordance with another embodiment. The support is for supporting the piezoelectric transformer in accordance with the first embodiment illustrated in FIG. 2. The piezoelectric transformer includes a piezoelectric body 1 having a diameter of 2.5 mm and a length of 4.2 mm.

As illustrated in FIG. 12A, the support includes a package 15 including a pair of spacers 16A and 16B facing each other and a pair of electrode plates 17A and 17B facing each other. The spacers 16A, 16B and electrode plates 17A, 17B cooperate with each other to thereby form an almost square cross-section. The spacers 16A and 16B are made of electrically insulating material, and the electrode plates 17A and 17B are also made of electrically insulating material with a metal layer 17a and 17b covering an outer surface thereof.

As illustrated in FIG. 12B, the electrode plates 17A and 17B are formed with a line of holes 18A and 18B, respectively. When the piezoelectric transformer is inserted into the package 15, the holes 18A are in alignment with every other strip-shaped electrodes, more specifically, k-th number electrodes 14-2, 14-4,—wherein k is an even number, whereas the holes 18B are in alignment with ever other strip-shaped electrodes, more specifically i-th number electrodes 14-1,14-3,—wherein i is an odd number.

The holes 18A and 18B are filled with resilient, electrically conductive material such as silicone rubber 19. Thus, the i-th number strip-shaped electrodes 14-1, 14-3,—are electrically connected with one another through the silicon rubber 19 and the metal layer 17b wherein i is an odd number, whereas the k-th number strip-shaped electrodes 14-2, 14-4,—are electrically connected with one another through the silicon rubber 19 and the metal layer 17a wherein k is an even number.

Lead wires 6A and 6B are electrically connected to the electrode plates 17A and 17B, respectively, and a lead wire 6C is electrically connected to an end surface of the piezoelectric body 1. An ac voltage is applied as input across the lead wires 6A and 6B, and as a result, a step-up voltage can be obtained as output through the lead wire 6C.

There was conducted a test for evaluating the above mentioned piezoelectric transformer fixed in the package 15 with respect to transformation efficiency in comparison with a piezoelectric transformer not fixed in the package. The result was that the piezoelectric transformer in accordance with the instant embodiment had a slightly smaller transformation efficiency than the other, but which did not exert a harmful influence on practical use of the piezoelectric transformer.

In the above mentioned embodiment, the package 15 is formed in a box shape, but it should be noted that the package may be formed in a cylinder into which a cylindrical piezoelectric body is jut fit.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-13670 on May 30, 1996 including specification, claims, drawings and summa incorporated herein by reference in its entirety.

What is claimed is:

1. A piezoelectric transformer comprising:
(a) a piezoelectric body made of piezoelectric material and longitudinally defining a driven section and a voltage generating section, said piezoelectric body being cylindrical in shape;
(b) a pair of input electrodes formed at a single curved surface of said piezoelectric body in said driven section for receiving ac voltage to oscillate said piezoelectric body to cause said piezoelectric body to produce a voltage; and
(c) an output electrode cooperating with one of said input electrodes to introduce the produced voltage therethrough.

2. The piezoelectric transformer as set forth in claim 1, wherein said input electrodes receive ac voltage having a frequency which causes longitudinal oscillation generated in said piezoelectric body to make first or higher order resonance in said piezoelectric body.

3. A piezoelectric transformer comprising:
(a) a solid cylindrical body made of piezoelectric material and longitudinally defining a driven section and a voltage generating section,
said voltage generating section being polarized in one of directions in a direction of a longitudinal axis of said cylindrical body;
(b) a pair of first electrodes formed at a curved surface of said cylindrical body in said driven section and defining a plurality of regions in said driven section in a direction of a longitudinal axis of said cylindrical body,
said first electrodes being electrically isolated with each other,
said regions being polarized so that every other regions are polarized in opposite directions in a direction of a longitudinal axis of said cylindrical body; and
(c) a second electrode cooperating with one of said first electrodes located closer to said voltage generating section to make a pair therewith.

4. The piezoelectric transformer as set forth in claim 3, wherein said driven section includes one of end surfaces of said cylindrical body and said voltage generating section includes the other, end surface and said second electrode is formed at said other end surface of said cylindrical body.

5. The piezoelectric transformer as set forth in claim 4, wherein said second electrode is formed at a curved surface and adjacent to said other end surface of said cylindrical body in place of being formed at said other end surface of said cylindrical body.

6. A piezoelectric transformer comprising:
(a) a solid cylindrical body made of piezoelectric material and longitudinally defining a driven section and a voltage generating section, said voltage generating section being polarized in one of directions in a direction of a longitudinal axis of said cylindrical body;
(b) a pair of first electrodes formed at a curved surface of said cylindrical body in said driven section and defining a plurality of regions in said driven section in a direction of a longitudinal axis of said cylindrical body,
said first electrodes being electrically isolated with each other, said regions being polarized so that adjacent regions are polarized in opposite directions in a direction of a longitudinal axis of said cylindrical body,
said pair of first electrodes comprising a plurality of strip-shaped electrodes wound around said cylindrical body and disposed in parallel with one another in a direction of a longitudinal axis of said cylindrical body, every other strip-shaped electrodes being in electrical communication with one another so that they have a common voltage; and
(c) a second electrode cooperating with one of said first electrodes located closer to said voltage generating section to make a pair therewith.

7. The piezoelectric transformer as set forth in claim 6, wherein said strip-shaped electrodes have the same width.

8. The piezoelectric transformer as set forth in claim 6, wherein said strip-shaped electrodes are equally spaced with one another in a direction of a longitudinal axis of said cylindrical body.

9. The piezoelectric transformer as set forth in claim 6, said every other strips-shaped electrodes are connected with one another by a wiring.

10. The piezoelectric transformer as set forth in claim 6, wherein said first electrodes receive ac voltage having a frequency which causes longitudinal oscillation generated in said cylindrical body to make first or higher order resonance in said cylindrical body.

11. The piezoelectric transformer as set forth in claim 6, wherein said cylindrical body has a diameter equal to a height thereof.

12. The piezoelectric transformer as set forth in claim 6 wherein said first and second electrodes are formed by curved-surface printing silver paste around said cylindrical body, and baking said silver paste.

13. The piezoelectric transformer as set forth in claim 6, wherein said driven section includes one of end surfaces of said cylindrical body and said voltage generating section includes the other, and said second electrode is formed at said other end surface of said cylindrical body.

14. The piezoelectric transformer as set forth in claim 13, wherein said second electrode is formed at a curved surface and adjacent to said other end surface of said cylindrical body in place of being formed at said other end surface of said cylindrical body.

15. A piezoelectric transformer comprising:
(a) a solid cylindrical body made of piezoelectric material and longitudinally defining a driven section and a voltage generating section, said voltage generating section being polarized in one of directions in a direction of a longitudinal axis of said cylindrical body;
(b) a pair of first electrodes formed at a curved surface of said cylindrical body in said driven section and defining a plurality of regions in said driven section in a direction of a longitudinal axis of said cylindrical body, said first electrodes being electrically isolated with each other, said regions being polarized so that every other regions are polarized in opposite directions in a direction of a longitudinal axis of said cylindrical body, each of said pair of first electrodes comprising a plurality of finger electrodes wound circumferentially around said cylindrical body and disposed in parallel with one another in a direction of a longitudinal axis of said cylindrical body, said finger electrodes having ends spaced away from each other, and a connection electrode extending between said ends of finger electrodes of the associated first electrode in a direction of a longitudinal axis of said cylindrical body and connecting said finger electrodes thereto, said finger electrodes of said pair of first electrodes being alternately arranged in parallel with each other; and
(c) a second electrode cooperating with one of said first electrodes located closer to said voltage generating section to make a pair therewith.

16. The piezoelectric transformer as set forth in claim 15, wherein said finger electrodes have the same width.

17. The piezoelectric transformer as set forth in claim 15, wherein said finger electrodes are equally spaced with one another in a direction of a longitudinal axis of said cylindrical body.

18. The piezoelectric transformer as set forth in claim 15, wherein said first electrodes receive ac voltage having a frequency which causes longitudinal oscillation generated in said cylindrical body to make first or higher order resonance in said cylindrical body.

19. The piezoelectric transformer as set forth in claim 15 wherein said first and second electrodes are formed by curved-surface printing silver paste around said cylindrical body, and baking said silver paste.

20. The piezoelectric transformer as set forth in claim 15, wherein said driven section includes one of end surfaces of said cylindrical body and said voltage generating section includes the other, and said second electrode is formed at said other end surface of said cylindrical body.

21. The piezoelectric transformer as set forth in claim 20, wherein said second electrode is formed at a curved surface and adjacent to said other end surface of said cylindrical body in place of being formed at said other end surface of said cylindrical body.

22. A piezoelectric transformer comprising:
(a) a cylindrical body made of piezoelectric material and longitudinally defining a driven section and a voltage generating section, said voltage generating section being polarized in one of directions in a direction of a longitudinal axis of said cylindrical body;
(b) a pair of first electrodes formed at a curved surface of said cylindrical body in said driven section and defining a plurality of regions in said driven section in a direction of a longitudinal axis of said cylindrical body, said first electrodes being electrically isolated with each other, said regions being polarized so that adjacent regions are polarized in opposite directions in a direction of a longitudinal axis of said cylindrical body, each of said pair of first electrodes comprising a spiral electrode; and
(c) a second electrode cooperating with one of said first electrodes located closer to said voltage generating section to make a pair therewith.

23. The piezoelectric transformer as set forth in claim 22, wherein said first electrodes receive ac voltage having a frequency which causes longitudinal oscillation generated in said cylindrical body to make first or higher order resonance in said cylindrical body.

24. The piezoelectric transformer as set forth in claim 22 wherein said first and second electrodes are formed by curved-surface printing silver paste around said cylindrical body, and baking said silver paste.

25. The piezoelectric transformer as set forth in claim 22, wherein said driven section includes one of end surfaces of said cylindrical body and said voltage generating section includes the other, and said second electrode is formed at said other end surface of said cylindrical body.

26. The piezoelectric transformer as set forth in claim 25, wherein said second electrode is formed at a curved surface and adjacent to said other end surface of said cylindrical body in place of being formed at said other end surface of said cylindrical body.

27. A piezoelectric transformer comprising:
(a) a cylindrical body made of piezoelectric material and longitudinally defining two driven sections and a voltage generating section sandwiched between said driven sections, each of said driven sections including an end surface of said cylindrical body, said voltage generating section being polarized in one of directions in a direction of a longitudinal axis of said cylindrical body;
(b) two pairs of first electrodes each of which is formed at a curved surface of said cylindrical body in each of said driven sections and defines a plurality of regions in each of said driven sections in a direction of a longitudinal axis of said cylindrical body, said first electrodes in each of said pairs being electrically isolated with each other, said regions in each of said driven sections being polarized so that adjacent regions are polarized in opposite directions in a direction of a longitudinal axis of said cylindrical body; and (c) a second electrode formed in said voltage generating section, said second electrode cooperating with first electrodes located closer to said voltage generating section to make a pair therewith.

28. The piezoelectric transformer as set forth in claim 27, wherein said regions in said driven sections are polarized symmetrically about said second electrode.

29. The piezoelectric transformer as set forth in claim 27 further comprising a plurality of lead wires for electrically connecting said piezoelectric transformer to an external terminal, said lead wires being connected to said piezoelectric transformer at nodes established in said cylindrical body when ac voltage is applied to said driven sections to thereby longitudinally oscillate said cylindrical body.

30. A piezoelectric transformer comprising:

(a) a cylindrical body made of piezoelectric material and longitudinally defining two driven sections and a voltage generating section sandwiched between said driven sections, each of said driven sections including an end surface of said cylindrical body, said voltage generating section being polarized in one of directions in a direction of a longitudinal axis of said cylindrical body;

(b) two pairs of first electrodes each of which is formed at a curved surface of said cylindrical body in each of said driven sections and defines a plurality of regions in each of said driven sections in a direction of a longitudinal axis of said cylindrical body, said first electrodes in each of said pairs being electrically isolated with each other, said regions in each of said driven sections being polarized so that adjacent regions are polarized in opposite directions in a direction of a longitudinal axis of said cylindrical body, each of said pairs of first electrodes comprising a plurality of strip-shaped electrodes wound around said cylindrical body and disposed in parallel with one another in a direction a longitudinal axis of said cylindrical body, every other strip-shaped electrodes being in electrical communication with one another so that they have a common voltage; and (c) a second electrode comprising a strip-shaped electrode wound around said cylindrical body at the longitudinal midpoint thereof, said second electrode cooperating with first electrodes located closer to said voltage generating section to make a pair therewith.

31. The piezoelectric transformer as set forth in claim 30, wherein said strip-shaped electrodes have the same width.

32. The piezoelectric transformer as set forth in claim 30, wherein said strip-shaped electrodes are equally spaced with one another in a direction of a longitudinal axis of said cylindrical body.

33. The piezoelectric transformer as set forth in claim 30, said every other strips-shaped electrodes are connected with one another by a wiring.

34. The piezoelectric transformer as set forth in claim 30, wherein said first electrodes receive ac voltage having a frequency which causes longitudinal oscillation generated in said cylindrical body to make first or higher order resonance in said cylindrical body.

35. The piezoelectric transformer as set forth in claim 30, wherein said cylindrical body has a diameter equal to a height thereof.

36. The piezoelectric transformer as set forth in claim 30 wherein said first and second electrodes are formed by curved-surface printing silver paste around said cylindrical body, and baking said silver paste.

37. The piezoelectric transformer as set forth in claim 30, wherein said regions in said driven sections are polarized symmetrically about said second electrode.

38. The piezoelectric transformer as set forth in claim 30 further comprising a plurality of lead wires for electrically connecting said piezoelectric transformer to an external terminal, said lead wires being connected to said piezoelectric transformer at nodes established in said cylindrical body when ac voltage is applied to said driven sections to thereby longitudinally oscillate said cylindrical body.

39. A piezoelectric transformer comprising:

(a) a cylindrical body made of piezoelectric material and longitudinally defining two driven sections and a voltage generating section sandwiched between said driven sections, each of said driven sections including an end surface of said cylindrical body, said voltage generating section being polarized in one of directions in a direction of a longitudinal axis of said cylindrical body;

(b) two pairs of first electrodes each of which is formed at a curved surface of said cylindrical body in each of said driven sections and defines a plurality of regions in each of said driven sections in a direction of a longitudinal axis of said cylindrical body, said first electrodes in each of said pairs being electrically isolated with each other, said regions in each of said driven sections being polarized so that adjacent regions are polarized in opposite directions in a direction of a longitudinal axis of said cylindrical body, each of said pairs of first electrodes comprising a plurality of finger electrodes wound circumferentially around said cylindrical body and disposed in parallel with one another in a direction of a longitudinal axis of said cylindrical body, said finger electrodes having ends spaced away from each other, and a connection electrode extending between said ends of finger electrodes of the associated first electrode in a direction of a longitudinal axis of said cylindrical body and connecting said finger electrodes thereto, said finger electrodes of said pair of first electrodes being alternately arranged in parallel with each other; and (c) a second electrode comprising a strip-shaped electrode wound around said cylindrical body at the longitudinal midpoint thereof, said second electrode cooperating with first electrodes located closer to said voltage generating section to make a pair therewith.

40. The piezoelectric transformer as set forth in claim 39, wherein said regions in said driven sections are polarized symmetrically about said second electrode.

41. The piezoelectric transformer as set forth in claim 39 further comprising a plurality of lead wires for electrically connecting said piezoelectric transformer to an external terminal, said lead wires being connected to said piezoelectric transformer at nodes established in said cylindrical body when ac voltage is applied to said driven sections to thereby longitudinally oscillate said cylindrical body.

42. A piezoelectric transformer comprising:
 (a) a cylindrical body made of piezoelectric material and longitudinally defining two driven sections and a voltage generating section sandwiched between said driven sections, each of said driven sections including an end surface of said cylindrical body;
 (b) two pairs of first electrodes each of which is formed at a curved surface of said cylindrical body in each of said driven sections and defines a plurality of regions in each of said driven sections in a direction of a longitudinal axis of said cylindrical body,
 said first electrodes in each of said pairs being electrically isolated with each other,
 said regions in each of said driven sections being polarized so that adjacent regions are polarized in opposite directions in a direction of a longitudinal axis of said cylindrical body,
 each of said first electrodes comprising a spiral electrode; and
 (c) a second electrode comprising a strip-shaped electrode wound around said cylindrical body at the longitudinal midpoint thereof,
 said second electrode cooperating with first electrodes located closer to said voltage generating section to make a pair therewith.

43. The piezoelectric transformer as set forth in claim 42, wherein said regions in said driven sections are polarized symmetrically about said second electrode.

44. The piezoelectric transformer as set forth in claim 42 further comprising a plurality of lead wires for electrically connecting said piezoelectric transformer to an external terminal, said lead wires being connected to said piezoelectric transformer at nodes established in said cylindrical body when ac voltage is applied to said driven sections to thereby longitudinally oscillate said cylindrical body.

45. A support for supporting a piezoelectric transformer therewith,
 said piezoelectric transformer comprising: (a) a cylindrical body made of piezoelectric material longitudinally defining a driven section and a voltage generating section; (b) a pair of input electrodes formed at a single curved surface of said cylindrical body in said driven section for receiving ac voltage to oscillate said cylindrical body to cause said cylindrical body to produce a voltage; and (c) an output electrode cooperating with one of said input electrodes to introduce said voltage therethrough,
 said support being made of resilient, electrically insulating material and supporting said piezoelectric transformer at nodes established in said cylindrical body when ac voltage is applied to said driven section to thereby longitudinally oscillate said cylindrical body.

46. A support for supporting a piezoelectric transformer therewith,
 said piezoelectric transformer comprising: (a) a cylindrical body made of piezoelectric material longitudinally defining a driven section and a voltage generating section; (b) a pair of first electrodes formed at a curved surface of said cylindrical body in said driven section for receiving ac voltage to oscillate said cylindrical body to cause said cylindrical body to produce a voltage; and (c) a second electrode cooperating with one of said first electrodes to introduce said voltage therethrough,
 said support comprising:
  (a) an enclosure through which said cylindrical body can be inserted; and
  (b) resilient, electrically insulating material to be sandwiched between an inner surface of said enclosure and an outer surface of said cylindrical body.

47. The support as set forth in claim 46 further comprising a housing in which said enclosure is fixed to said housing.

48. The support as set forth in claim 46, wherein said enclosure is ring-shaped.

49. The support as set forth in claim 46, wherein said insulating material is silicone resin.

50. The support as set forth in claim 46, wherein said support supports said piezoelectric transformer at a longitudinal midpoint of said cylindrical body.

51. A support for supporting a piezoelectric transformer therewith,
 said piezoelectric transformer comprising: (a) a cylindrical body made of piezoelectric material longitudinally defining a driven section and a voltage generating section; (b) a pair of first electrodes formed at a curved surface of said cylindrical body in said driven section for receiving ac voltage to oscillate said cylindrical body to cause said cylindrical body to produce a voltage; and (c) a second electrode cooperating with one of said first electrodes to introduce said voltage therethrough,
 said support comprising a plurality of supporting members made of resilient, electrically conductive material and supporting said piezoelectric transformer at said first and second electrodes therewith, said first and second electrodes being in electrical communication with an external terminal through said supporting members.

52. A support for supporting a piezoelectric transformer therewith,
 said piezoelectric transformer comprising: (a) a cylindrical body made of piezoelectric material longitudinally defining a driven section and a voltage generating section; (b) a pair of first electrodes formed at a curved surface of said cylindrical body in said driven section for receiving ac voltage to oscillate said cylindrical body to cause said cylindrical body to produce a voltage; and (c) a second electrode cooperating with one of said first electrodes to introduce said voltage therethrough,
 said support comprising:
  (a) an enclosure made of electrically insulating material for enclosing said piezoelectric transformer therein, said enclosure being formed at an outer wall thereof with a plurality holes; and
  (b) resilient, electrically conductive material filled in said holes and making contact with said first electrodes, which are in electrical connection with an external terminal through said electrically conductive material.

53. The support as set forth in claim 52, wherein said holes comprising first and second sets of holes, each of said first and second sets of holes being formed in alignment with each of said first electrodes.

54. The support as set forth in claim 52, wherein said enclosure is rectangular in shape.

55. The support as set forth in claim 52, wherein said enclosure is circular in shape.

56. The support as set forth in claim 53, wherein said enclosure is rectangular in shape, said first and second sets of holes being formed with each of planes of said enclosure facing each other, said resilient, electrically conductive material filled in said first and second sets of holes being in electrical connection with each other, respectively.

57. The support as set forth in claim 56, wherein said planes make tangential contact with said cylindrical body.

58. The support as set forth in claim 52, wherein said resilient, electrically conductive material is silicone rubber.

* * * * *

UNITED STATES PATENT AND TRADEMARK OFFICE
CERTIFICATE OF CORRECTION

PATENT NO. : 5,861,704
DATED : January 19, 1999
INVENTOR(S) : Tsuyoshi KITAMI et al.

It is certified that error appears in the above-identified patent and that said Letters Patent is hereby corrected as shown below:

Column 2, line 59, delete "14a" and insert --141a--.

Column 19, line 55, delete "summa" and insert --summary--.

Signed and Sealed this

Twentieth Day of July, 1999

Attest:

Q. TODD DICKINSON

*Attesting Officer*　　　　　*Acting Commissioner of Patents and Trademarks*